US012687563B2

(12) United States Patent
Pickerd et al.

(10) Patent No.: US 12,687,563 B2
(45) Date of Patent: Jul. 21, 2026

(54) SEPARATING NOISE TO INCREASE MACHINE LEARNING PREDICTION ACCURACY IN A TEST AND MEASUREMENT SYSTEM

(71) Applicant: Tektronix, Inc., Beaverton, OR (US)

(72) Inventors: John J. Pickerd, Hillsboro, OR (US); Kan Tan, Portland, OR (US)

(73) Assignee: Tektronix, Inc., Beaverton, OR (US)

(*) Notice: Subject to any disclaimer, the term of this patent is extended or adjusted under 35 U.S.C. 154(b) by 431 days.

(21) Appl. No.: 18/208,562

(22) Filed: Jun. 12, 2023

(65) Prior Publication Data

US 2023/0408550 A1 Dec. 21, 2023

Related U.S. Application Data

(60) Provisional application No. 63/352,592, filed on Jun. 15, 2022.

(51) Int. Cl.
*G01R 13/02* (2006.01)
*G01R 31/00* (2006.01)
*G06N 3/08* (2023.01)

(52) U.S. Cl.
CPC ......... *G01R 13/029* (2013.01); *G01R 31/001* (2013.01); *G06N 3/08* (2013.01)

(58) Field of Classification Search
CPC ...... G01R 13/029; G01R 31/001; G06N 3/08; G06N 3/045
See application file for complete search history.

(56) References Cited

U.S. PATENT DOCUMENTS

| | | | |
|---|---|---|---|
| 5,272,723 A | 12/1993 | Kimoto | |
| 5,397,981 A | 3/1995 | Wiggers | |
| 5,594,655 A | 1/1997 | Berchin | |

(Continued)

FOREIGN PATENT DOCUMENTS

| | | |
|---|---|---|
| CN | 107342810 | 11/2019 |
| EP | 2743710 | 9/2018 |

(Continued)

OTHER PUBLICATIONS

Arughese et al. (Accelerating Assessments of Optical Components Using Machine Learning: TDECQ as Demonstrated Example, 2021). (Year: 2021).*

(Continued)

*Primary Examiner* — Mohammad K Islam
(74) *Attorney, Agent, or Firm* — Miller Nash LLP; Andrew J. Harrington

(57) ABSTRACT

A test and measurement instrument has an input port to allow the instrument to receive one or more waveforms from a device under test (DUT), one or more low pass filters to remove a portion of the noise from the one or more waveforms, and one or more processors to: select a waveform pattern from the waveforms, measure noise in the one or more waveforms and generate a noise representation of the noise removed, create one or more images using the waveform pattern and the one or more filtered waveforms, add the noise representation to the one or more images to produce at least one combined image, input the at least one combined image to one or more deep learning networks, and receive one or more predicted values for the DUT.

21 Claims, 6 Drawing Sheets

(56)         References Cited

U.S. PATENT DOCUMENTS

| | | |
|---|---|---|
| 6,807,496 B2 | 10/2004 | Pickerd |
| 7,181,146 B1 | 2/2007 | Yorks |
| 7,298,463 B2 | 11/2007 | French |
| 8,583,395 B2 | 11/2013 | Dybsetter |
| 8,861,578 B1 | 10/2014 | Lusted |
| 9,059,803 B2 | 6/2015 | Detofsky |
| 9,130,751 B2 | 9/2015 | Zivny |
| 9,337,993 B1 | 5/2016 | Lugthart |
| 9,548,858 B1 | 1/2017 | Cirit |
| 9,699,009 B1 | 7/2017 | Ainspan |
| 9,709,605 B2 | 7/2017 | Alley |
| 10,171,161 B1 | 1/2019 | Cote |
| 10,209,276 B2 | 2/2019 | Tan |
| 10,236,982 B1 | 3/2019 | Zhuge |
| 10,270,527 B1 | 4/2019 | Mentovich |
| 10,396,897 B1 | 8/2019 | Malave |
| 10,585,121 B2 | 3/2020 | Absher |
| 10,727,973 B1 | 7/2020 | Kumar |
| 10,852,323 B2 | 12/2020 | Schaefer |
| 10,863,255 B2 | 12/2020 | Zhang |
| 11,005,697 B2 | 5/2021 | Liston |
| 11,040,169 B2 | 6/2021 | Jung |
| 11,095,314 B2 | 8/2021 | Medard |
| 11,177,986 B1 | 11/2021 | Ganesan |
| 11,233,561 B1 | 1/2022 | O'Shea |
| 11,237,190 B2 | 2/2022 | Rule |
| 11,336,378 B2 | 5/2022 | Bottoni |
| 11,388,081 B1 | 7/2022 | Sommers |
| 11,476,967 B2 | 10/2022 | Geng |
| 11,646,863 B2 | 5/2023 | Balan |
| 11,695,601 B2 | 7/2023 | Sudhakaran |
| 2002/0063553 A1 | 5/2002 | Jungerman |
| 2003/0053170 A1 | 3/2003 | Levinson |
| 2003/0208330 A1 | 11/2003 | Pickerd |
| 2003/0220753 A1 | 11/2003 | Pickerd |
| 2004/0032889 A1 | 2/2004 | Hidaka |
| 2004/0121733 A1 | 6/2004 | Peng |
| 2004/0131365 A1 | 7/2004 | Lee |
| 2004/0136422 A1 | 7/2004 | Mahowald |
| 2004/0165622 A1 | 8/2004 | Lu |
| 2004/0223544 A1 | 11/2004 | Upton |
| 2004/0236527 A1 | 11/2004 | Felps |
| 2005/0222789 A1 | 10/2005 | West |
| 2005/0246601 A1 | 11/2005 | Waschura |
| 2005/0249252 A1 | 11/2005 | Sanchez |
| 2006/0120720 A1 | 6/2006 | Hauenschild |
| 2008/0126001 A1 | 5/2008 | Murray |
| 2008/0159737 A1 | 7/2008 | Noble |
| 2008/0212979 A1 | 9/2008 | Ota |
| 2009/0040335 A1 | 2/2009 | Ito |
| 2011/0085793 A1 | 4/2011 | Oomori |
| 2011/0161738 A1 | 6/2011 | Zhang |
| 2011/0286506 A1 | 11/2011 | Libby |
| 2012/0226727 A1 | 9/2012 | Zivny |
| 2013/0046805 A1 | 2/2013 | Smith |
| 2014/0093233 A1 | 4/2014 | Gao |
| 2014/0163914 A1 | 6/2014 | Alley |
| 2014/0343883 A1 | 11/2014 | Libby |
| 2015/0003505 A1 | 1/2015 | Lusted |
| 2015/0055694 A1 | 2/2015 | Juenemann |
| 2015/0207574 A1 | 7/2015 | Schoen |
| 2015/0350042 A1 | 12/2015 | Zivny |
| 2016/0191168 A1 | 6/2016 | Huang |
| 2016/0328501 A1 | 11/2016 | Chase |
| 2018/0006721 A1 | 1/2018 | Ishizaka |
| 2018/0045761 A1 | 2/2018 | Tan |
| 2018/0074096 A1 | 3/2018 | Absher |
| 2018/0204117 A1 | 7/2018 | Brevdo |
| 2018/0219636 A1 | 8/2018 | Gale |
| 2018/0356655 A1 | 12/2018 | Welch |
| 2019/0038387 A1 | 2/2019 | Chu |
| 2019/0278500 A1 | 9/2019 | Lakshmi |
| 2019/0332941 A1 | 10/2019 | Towal |
| 2019/0370158 A1 | 12/2019 | Rivoir |
| 2019/0370631 A1 | 12/2019 | Fais |

| | | | |
|---|---|---|---|
| 2020/0035665 A1 | 1/2020 | Chuang | |
| 2020/0057824 A1 | 2/2020 | Yeh | |
| 2020/0166546 A1 | 5/2020 | O'Brien | |
| 2020/0195353 A1 | 6/2020 | Ye | |
| 2020/0229206 A1 | 7/2020 | Badic | |
| 2020/0313999 A1 | 10/2020 | Lee | |
| 2020/0335029 A1 | 10/2020 | Gao | |
| 2021/0041499 A1 | 2/2021 | Ghosal | |
| 2021/0067888 A1* | 3/2021 | Jain | G06F 3/167 |
| 2021/0105548 A1 | 4/2021 | Ye | |
| 2021/0111794 A1 | 4/2021 | Huang | |
| 2021/0160109 A1 | 5/2021 | Seol | |
| 2021/0167864 A1 | 6/2021 | Razzell | |
| 2021/0314081 A1 | 10/2021 | Shattil | |
| 2021/0389373 A1 | 12/2021 | Pickerd | |
| 2021/0390456 A1 | 12/2021 | Pickerd | |
| 2022/0070040 A1 | 3/2022 | Namgoong | |
| 2022/0076715 A1 | 3/2022 | Lee | |
| 2022/0121388 A1 | 4/2022 | Woo | |
| 2022/0182139 A1 | 6/2022 | Zhang | |
| 2022/0199126 A1 | 6/2022 | Lee | |
| 2022/0200712 A1 | 6/2022 | Lillie | |
| 2022/0215865 A1 | 7/2022 | Woo | |
| 2022/0236326 A1 | 7/2022 | Schaefer | |
| 2022/0239371 A1 | 7/2022 | Xu | |
| 2022/0247648 A1 | 8/2022 | Pickerd | |
| 2022/0311513 A1 | 9/2022 | Pickerd et al. | |
| 2022/0311514 A1 | 9/2022 | Smith et al. | |
| 2022/0334180 A1 | 10/2022 | Pickerd | |
| 2022/0373597 A1 | 11/2022 | Agoston | |
| 2022/0373598 A1 | 11/2022 | Tan et al. | |
| 2022/0385374 A1 | 12/2022 | Arikawa | |
| 2022/0390515 A1 | 12/2022 | Pickerd | |
| 2022/0393914 A1 | 12/2022 | Tan | |
| 2022/0407595 A1 | 12/2022 | Varughese | |
| 2023/0050162 A1 | 2/2023 | Tan | |
| 2023/0050303 A1 | 2/2023 | Pickerd | |
| 2023/0052588 A1 | 2/2023 | Sudhakaran | |
| 2023/0088409 A1 | 3/2023 | Parsons | |
| 2023/0098379 A1 | 3/2023 | Smith | |
| 2023/0194599 A1 | 6/2023 | Gilabert | |
| 2023/0228803 A1 | 7/2023 | Sun | |
| 2023/0239182 A1 | 7/2023 | Ikeda | |
| 2023/0299862 A1 | 9/2023 | O'Shea | |
| 2023/0306578 A1 | 9/2023 | Pickerd | |
| 2023/0314498 A1 | 10/2023 | Pickerd | |
| 2025/0032212 A1* | 1/2025 | Oelze | G01S 15/8959 |

FOREIGN PATENT DOCUMENTS

| | | |
|---|---|---|
| EP | 3936877 | 1/2022 |
| JP | 6560793 | 8/2019 |
| WO | 2021092156 | 5/2021 |
| WO | 2022171645 | 8/2022 |
| WO | 2022189613 | 9/2022 |

OTHER PUBLICATIONS

Varughese et al. (Accelerating TDECQ Assessments using Convolutional Neural Networks, 2020). (Year: 2020).*

Varughese, Siddarth, et al., Accelerating Assessments of Optical Components Using Machine Learning: TDECQ as Demonstrated Example, Journal of Lightwave Technology, Jan. 1, 2021, pp. 64-72, vol. 39, No. 1, IEEE.

Varughese, Siddarth, et al., Accelerating TDECQ Assessments using Convolutional Neural Networks, OFC, Mar. 2020, 3 pages, The Optical Society (OSA).

Watts et al., "Performance of Single-Mode Fiber Links Using Electronic Feed-Forward and Decision Feedback Equalizers", 2005, IEEE Photonics Techology Letters, vol. 17, No. 10, pp. 2206-2208 (Year: 2005).

Echeverri-Chacon et al., "Transmitter and Dispersion Eye Closure Quaternary (TDECQ) and Its Sensitivity to Impairments in PAM4 Waveforms", 2019, Journal of Lightwave Technology, vol. 37, No. 3, pp. 852-860 (Year: 2019).

(56) References Cited

OTHER PUBLICATIONS

Wang et al., "Intelligent Constellation Diagram Analyzer Using Convolutional Neural Network-Based Deep Learning," Optics Express, Jul. 24, 2017, vol. 25, No. 15.

* cited by examiner

SEPARATING NOISE TO INCREASE MACHINE LEARNING PREDICTION ACCURACY IN A TEST AND MEASUREMENT SYSTEM

CROSS-REFERENCE TO RELATED APPLICATIONS

This disclosure claims benefit of U.S. Provisional Application No. 63/352,592, titled "SEPARATING NOISE TO INCREASE MACHINE LEARNING PREDICTION ACCURACY IN A TEST AND MEASUREMENT SYSTEM," filed on Jun. 15, 2022, the disclosure of which is incorporated herein by reference in its entirety.

TECHNICAL FIELD

This disclosure relates to test and measurement systems, and more particularly to a machine learning component of a test and measurement system.

DESCRIPTION

U.S. patent application Ser. No. 17/701,186, titled "OPTICAL TRANSMITTER TUNING USING MACHINE LEARNING AND REFERENCE PARAMETERS," and U.S. patent application Ser. No. 17/701,411, titled "OPTICAL TRANSCEIVER TUNING USING MACHINE LEARNING," each filed Mar. 22, 2022, describe test and measurement systems that employ machine learning components in the process of tuning optical transceivers, which may include measuring or predicting a Transmitter Dispersion Eye Closure Quaternary (TDECQ) value for the optical transmitters or transceivers. U.S. patent application Ser. No. 17/747,954, titled "SHORT PATTERN WAVEFORM DATABASE BASED MACHINE LEARNING FOR MEASUREMENT," filed May 18, 2022, describes using a database of short segments of symbol patterns, depicted as tensor images, in both the training and runtime of machine learning systems for predicting a TDECQ value or other measurements. The entire contents of each of these applications is hereby incorporated by reference into this application.

Noise makes up a major portion of many performance measurements used in characterizing devices under test (DUT). For example, TDECQ (Transmitter Dispersion and Eye Closure Quaternary) calculates the degradation that a receiver may add to a signal. The degradation includes noise, intersymbol interference (ISI), etc. Conventional measurement techniques typically do not remove noise from a waveform prior to making the TDECQ measurement.

However, in systems that use machine learning to analyze DUT performance or provide predictions about operating/tuning parameters, noise can cause problems. These types of machine learning systems use waveform data for training and for run-time to make predictions having a predicted error. If the waveforms have high levels of noise, the training of the machine learning system may result in predictions with error that is too high.

DETAILED DESCRIPTION

Figure 1:
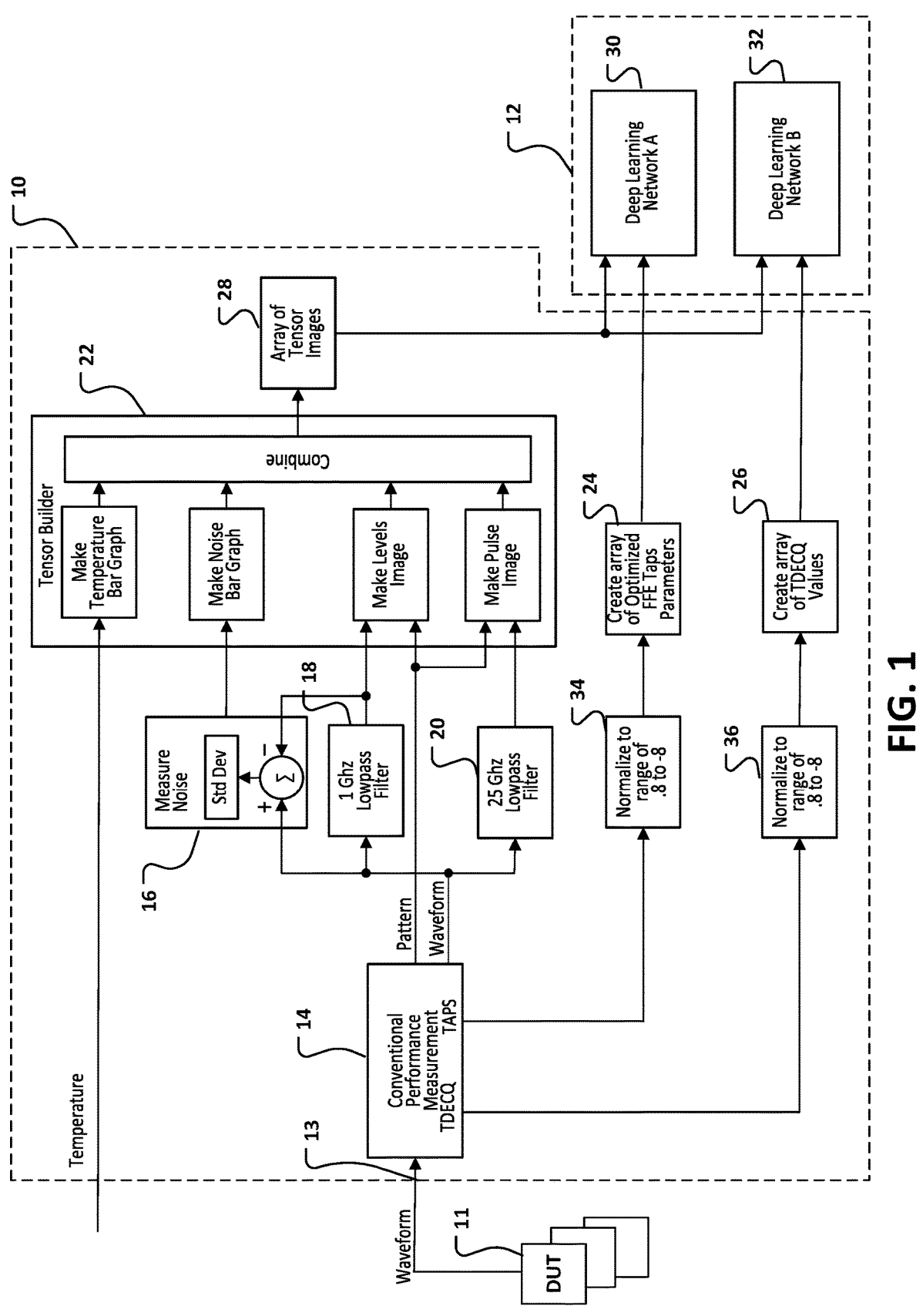
FIG. 1 shows an embodiment of a system to train deep learning networks.

In contrast to conventional techniques that do not remove noise in making performance measurements, the embodiments described herein filter out as much noise as possible from acquired waveforms prior to submitting them to a machine learning system. The embodiments do measure the noise prior to filtering and save a representation of the noise. The machine learning system of the embodiments uses image tensors for both training and operation, allowing for faster analysis of the images. The embodiments include the representation of the noise in the image, such as a bar graph or histogram. Removing the noise from the waveforms reduces the prediction error to an acceptable level, while still accounting for the noise in the tensor images. The embodiments result in less standard deviation of the error for making machine learning predictions of measurements and tuning parameters.

The embodiments generate tensor images used by the machine learning system to produce the predicted values. The tensor image may comprise a levels image, a pulse image, or both. The machine learning system uses the images to produce predicted values for a performance measurement, such as TDECQ (transmitter dispersion and eye closure quaternary), or feed-forward equalizer parameters, or operational parameters, also referred to herein as tuning parameters. The tuning parameters may comprise levels and gain tuning parameters.

TDECQ provides an example of a performance measurement. For predicting performance measurements, training of the deep learning network takes noise into account. For example, the embodiments do not remove noise from the waveform when using a conventional TDECQ measurement to be the actual reference TDECQ value for training. But, for the waveform used to train with and associate with that TDECQ value, the process removes as much noise as possible from the waveform prior to putting it into the short pattern tensor image. The noise is accounted for in the value of TDECQ used for training, but the noise is removed from the waveform tensor image used for training. This results in the deep learning network being able to more accurately extract the desired characteristics of the waveform associated with the parameter or measurement predicted.

Also, the noise value is placed into a bar graph or other noise representation in the image so that it does not interfere with waveform feature extraction process. The noise is still considered, in the form of some sort of noise representation such as a bar graph, histogram, etc. This results in the prediction results having more accuracy and more consistency with less deviation.

The graphic image representing noise, such as a bar graph or a pie graph, etc., is placed in a different part of the tensor image, for example on a border of the image, or in an unused color channel. This approach is a unique technique for handling noise. The performance measurement prediction adequately takes the noise on the waveform into account when making a prediction. On the other hand, when predicting transmitter tuning parameters, the noise may not affect the values of the parameter to be predicted. For those cases, the noise bar graph would not be needed, but may still be included. However, if some of the parameters such as gain control do affect the noise level then the noise bar graph will allow the deep learning network to consider the noise values.

FIGS. 1-4 illustrate embodiments of machine learning system configurations according to some example embodiments of the disclosure. One aspect is that lowpass filters of two different bandwidths are used to remove noise from the input waveforms. The waveform for creating levels images for the tensor has a much lower lowpass cutoff frequency of 1 GHz in the examples shown. The waveform used for creating pulse short pattern images has a higher lowpass cutoff frequency of 25 GHz in the examples shown below. This is because it is necessary to maintain a higher bandwidth of signal content when observing the pulse responses. The cutoff frequencies of both lowpass filters may be fixed for a given application or they may be set from menu or PI (programmatic interface) commands for more general applications.

The tensor images include separate bar graphs or other representations for either or both temperature and noise. As the test and measurement instrument generates grayscale images or color hyperspectral images it may place the noise representation in all three color channels or in any single color channel or in any combination of color channels. The temperature and noise representation may take one of many different forms other than a bar graph.

The noise estimate by a noise representation in the short pattern tensor image, is handled in a novel manner. In one embodiment, the lowpass waveform resulting from the lower cutoff frequency is subtracted from the input waveform, and the standard deviation of the difference becomes the noise estimate. This subtracts out the PAM4 waveform pattern and it subtracts out all noise in the 1 GHz pass band of the filter. The difference is then the noise that is in the high pass band above 1 GHz in the original waveform. The novelty of this approach has two aspects. First, it does not have to be the 'actual' noise in the full bandwidth signal. It only needs to be a relative measure proportional to that full bandwidth noise for the deep learning network to properly take it into account for association for a performance measurement. For some output predictions the noise is irrelevant. Therefore, having it in the form of a noise representation results in isolating it from the waveform view where the deep learning network can then more accurately extract the features with which it needs to associate a predicted measurement.

With reference to the embodiments of the system in FIGS. 1-4, the system may contain several of the below components. The diagrams use the same reference numbers for each component, with some variations between the embodiments noted by different reference numbers. The embodiments employ a test and measurement instrument 10, such as an oscilloscope, and a machine learning system 12. Typically, the test and measurement instrument may interface to a customer's test system on the manufacturing floor, where the customer's test system performs testing and validation of multiple devices under test (DUT) in parallel. The machine learning system may reside in the test and measurement instrument but will typically reside in a separate computing system. The system therefore includes one or more processors, with at least one processor in each computing system, and in many cases, each computing system may have two or more processors. The various components discussed below may take the form of code to be executed by one or more processors in the system.

Test and measurement instrument 10 has a port 13 to interface with one or more DUTs 11 to allow the test and measurement instrument to acquire waveforms from the DUTs. In one embodiment, the DUTs may comprise optical transmitters, but any type of electronic DUT that produces a waveform during operation would work. In addition to the waveform, the instrument may also receive temperature from a temperature sensor on each DUT, or one located in the testing environment.

A conventional performance measurement module 14 will receive the input, or original, waveforms. FIG. 1 shows a system used for predicting a performance measurement such as TDECQ, and its associated FFE taps in the training environment. During training, the conventional performance measurement module 14 exists in currently available instruments such as in some of Tektronix's sampling oscilloscopes. This module performs several operations. It resamples the waveform to a desired sample per UI (unit interval), recovers the clock from the waveform, decodes the waveform pattern, aligns the pattern codes with the waveform, and computes the performance measurement, such as TDECQ 26 and computes optimized FFE taps 24. The module only computes the pattern once because all waveforms input to the system shall have that same pattern. The systems here use the output pattern and the output waveform. The system only uses conventionally measured performance measurements, such as TDECQ and the optimized FFE taps outputs for training whichever of the deep learning networks 30 and 32 will predict the performance measurement.

Noise measurement block 16 measures the noise on the waveform prior to filtering out the noise. This measured value inputs to the tensor builder block creating a noise representation. The noise measurement block subtracts the 1 GHz lowpass filtered waveform from the input original waveform. The difference removes the PAM4 (pulse amplitude modulation 4) signal and leaves the noise above the 1 GHz high passband producing a filtered waveform, which may also be referred to as a noise-reduced waveform. The block takes the standard deviation of the high passband difference, which is then used as the noise estimate. The system represents this by a bar graph of other representation of size proportional to this noise estimate. In one embodiment, the instrument uses a first lowpass filter 18 to remove as much noise as reasonably possible, producing a filtered waveform using the creation of the levels image. The cutoff frequency may be fixed, controlled from menu or PI commands, and may vary depending upon the DUT and the performance measurement. The system may use a second lowpass filter 20 to remove as much noise as reasonably possible and uses this filtered waveform for the creation of the pulse image. As with the first filter, the cutoff frequency may be fixed, controlled from menu or PI commands, and may vary depending upon the DUT and the performance measurement.

Figure 5:
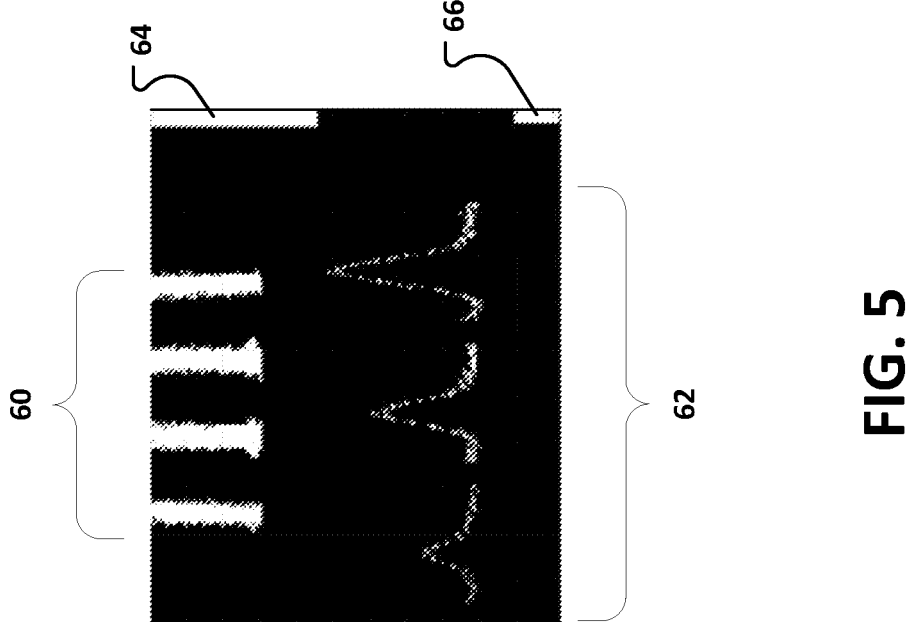
FIG. 5 shows an example of a grayscale tensor image including temperature and noise data.

The tensor builder 22 creates a grayscale or hyperspectral image used for training deep learning networks, or for input to trained networks for prediction of outputs. This block also receives a system temperature input value and creates a bar graph for the temperature and combines it into the tensor image. This block also receives the waveform noise value as input and creates a noise bar graph image and combines it into the tensor image. For the performance measurement embodiment, FIG. 5 shows an example image, having the levels image 60, the pulse image 62, the noise representation 64, and the temperature bar graph 66.

For training, the system operates on a large number of waveforms. Each waveform results in a tensor image for the performance measurement value and associated values, such as FFE taps for TDECQ. Each tensor image becomes a member of an array of tensor images used to train one or more deep learning networks in machine learning system 12. In one embodiment, there are two deep learning networks, network A and network B. In practice, multiple networks may exist. The array of tensors has an array of metadata associated with it. In some instances, as discussed below, the array of metadata varies depending upon the predicted values desired from the machine learning system. In the embodiment of FIG. 1, the metadata comprises the performance measurement, TDECQ, values, and filter taps received from the conventional performance measurement system. Other embodiments may have optimized operational, or tuning, parameters for the DUTs, for tuning parameters and taps, and separately for gains and levels for the DUTs.

These networks undergo training to associate tensor image inputs with measurement or transmitter optimized tuning parameter inputs. After they are trained then the tensor images are input and prediction of measurements and/or optimized tuning parameter values are output. These networks undergo training with the images resulting from removal of the noise, with the noise included as a representation in a portion of the image. As mentioned above, this allows the deep learning networks to achieve a desired level of prediction error.

Depending upon the network architecture, the performance measurement values sent to the machine learning system may undergo normalization. In one embodiment, the values are normalized to a range from 0.8 to –0.8. In the embodiment of FIG. 1, since the measurement module 14 has two outputs, the system has two normalization processes or modules 34 and 36. If normalization is applied, the output predicted values have to be inversely normalized during run time. For training purposes, the network(s) do not output a value, so nothing needs to be done. When needed, inverse normalization removes the normalization applied during run time when the deep learning network provides the predicted values. This transforms the predicted range of values in –1 to 1 range and restores the predicted value to its actual range.

One should note that in the embodiment of FIG. 1, the tensor image inputs to the deep learning network do not have the normalization block shown external because the networks in use may include internal normalization blocks. This shows only one variation, the network may include normalization for all the inputs to the machine learning system, normalization for the tensor images with external normalization for the performance measurement inputs, or external normalization for all inputs to the machine learning system 12.

Figure 2:
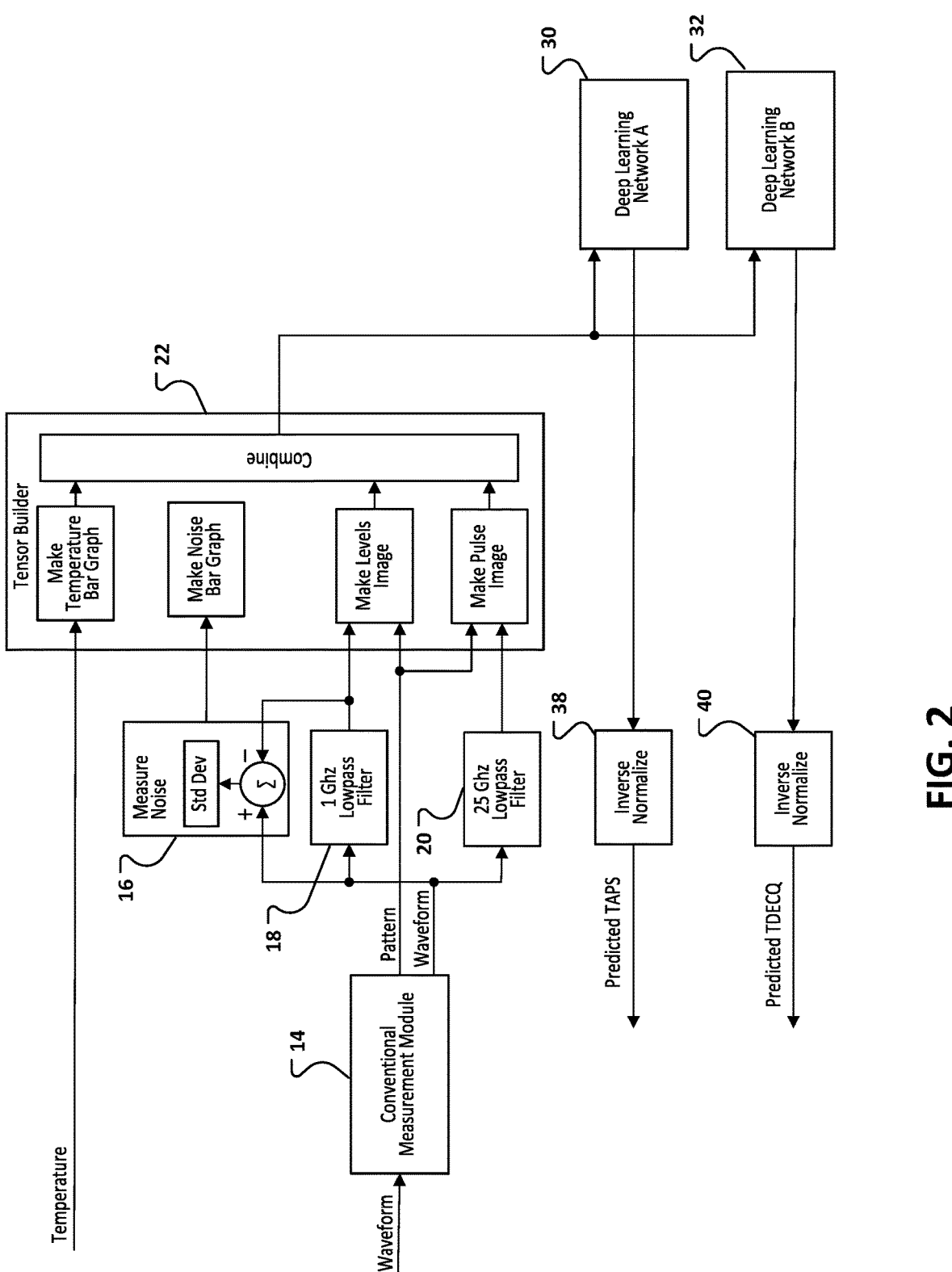
FIG. 2 shows an embodiment of a system using deep learning networks to predict performance measurements for a device under test.

FIG. 2 shows the network of FIG. 1 during run time. The references to instrument 10 and machine learning system 12 have been removed for simplicity, but still apply to this figure. In FIG. 2, the machine learning system predicts the values of the performance measurement, in this embodiment the TDECQ measurement and associated FFE taps, the conventional measurement module does not generate those measurements. It still performs the other tasks discussed above and provides the pattern and the waveform to the low pass filters and the tensor builder. During run time, the tensor builder 22 may only create one tensor image for the deep learning networks 30 and 32. These networks then provide the performance measurement and other associated predicted values. In the case of a TDECQ measurement, one network may provide the predicted value for the measurement and another network may provide the FFE taps. In other embodiments, only one network may provide one predicted value for a different performance measurement.

The embodiments of FIGS. 1 and 2 show an overall system and method for training and running a machine learning system with noise-removed waveforms for tensor images to produce a performance measurement. This provides one example of a system that operates with noise-removed data for training and operations, where the tensor image accounts for noise, but does not include the noise in the levels image or the pulse image. This approach applies to other networks used to generate predicted values for DUTs, as shown in FIGS. 3 and 4.

Figure 3:
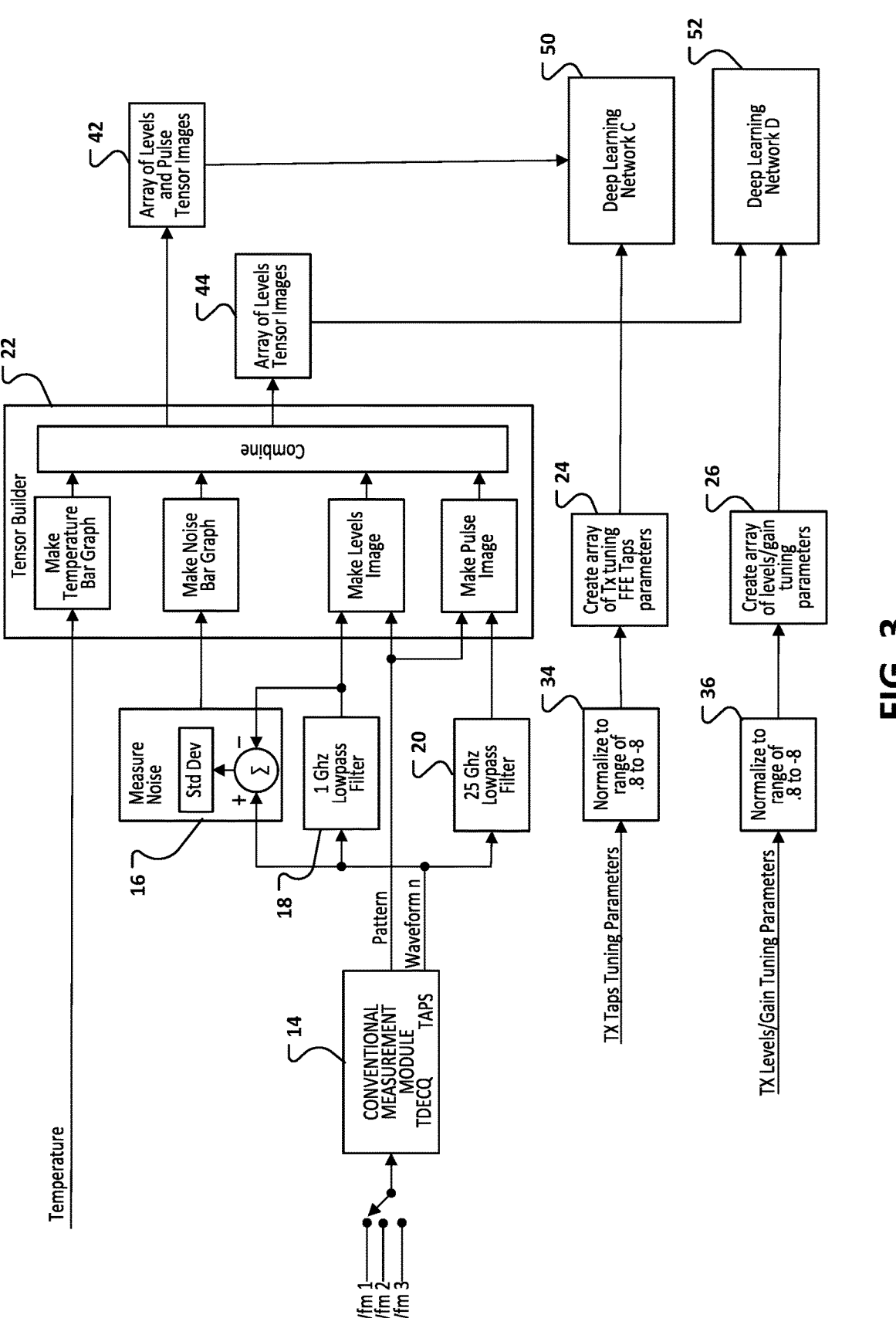
FIG. 3 shows another embodiment of a system to train deep learning networks.
Figure 4:
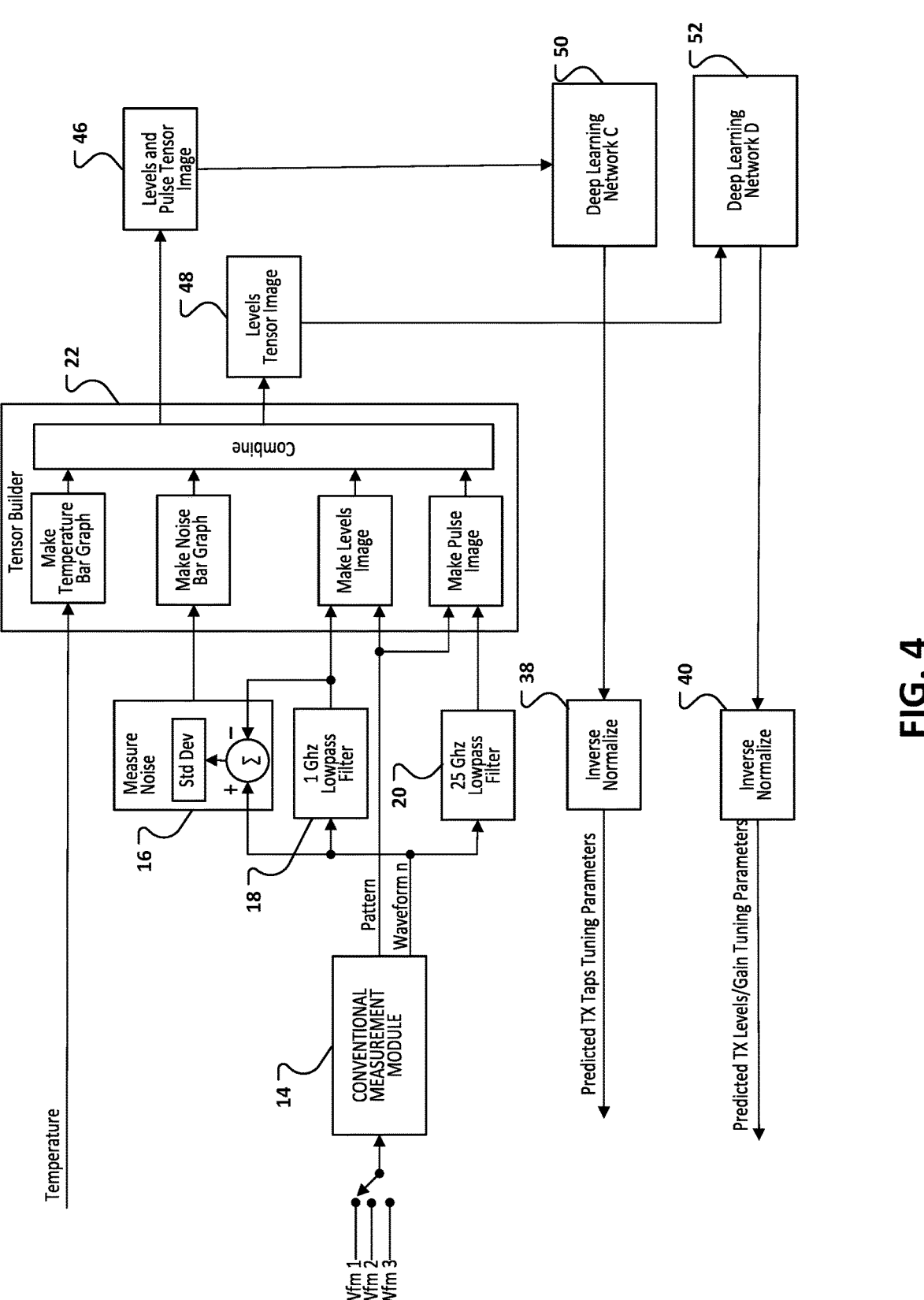
FIG. 4 shows an embodiment of a system using deep learning networks to predict operational parameters for devices under test.

In FIGS. 3 and 4, the predicted value(s) comprise operational, or tuning, parameter, for the DUTs. These parameters, in this embodiment, comprise levels and gains for optical transmitters, and tuning taps for the filters in the transmitter. However, these values could comprise only one of those parameters, or other parameters entirely.

In FIG. 3, the components remain the same, but the operation varies during the training portion. The conventional measurement module 14 will receive a number of waveforms for a given DUT and will receive the number of waveforms from a plurality of DUTs to build the training set. These may result from any number of different sets of tuning parameters at which the optical transmitter operates for building the training set. In one approach, set out in the patent applications mentioned previously, the DUT produces a waveform for each of three different parameter sets, a mean parameter set, a first delta set in which the mean parameters have some value added to them, and a second delta set in which the mean parameters have some value subtracted from them, where the value for the first and second delta sets may be the same or different.

Figure 6:
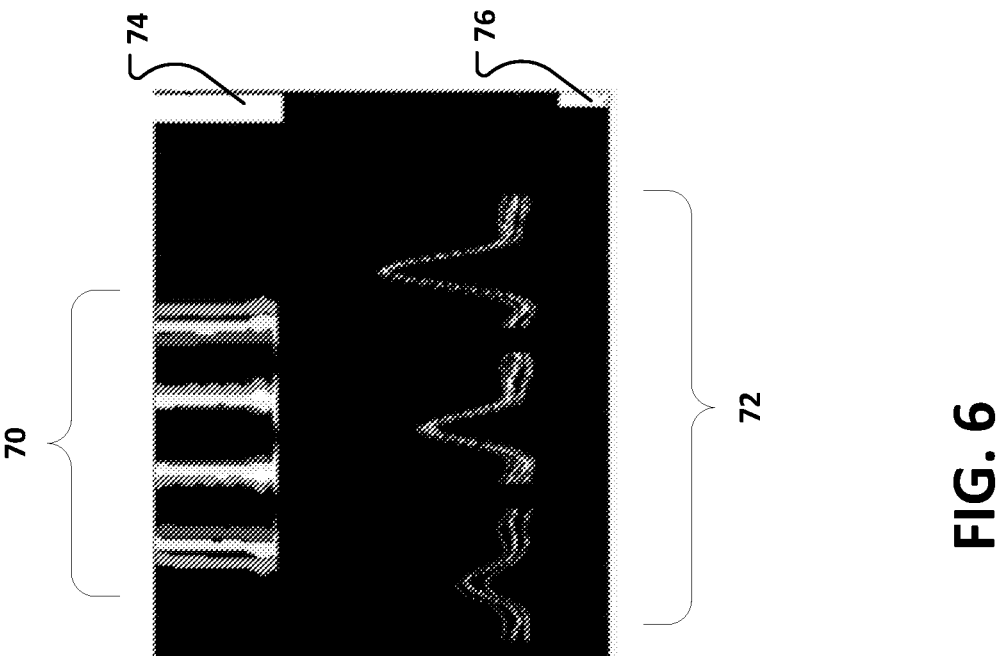
FIG. 6 shows an example of a hyperspectral tensor image including temperature and noise data for predicting operational parameters for devices under test.

Each of these waveforms is processed as before, undergoing noise measurement at 16 and reduction with the lowpass filters 18 and 20, and the tuning parameters 24, and levels and gains 26, undergoing normalization as needed at 34 and 36. However, the tensor builder 22, instead of producing a single grayscale image, produces a hyperspectral image having three color channels. Each color channel contains the levels image 70, the pulse image 72, and the noise and temperature bar graphs, 74 and 76. FIG. 6 shows an example of such an image. In the levels image 70, the three different colors represent the three different settings for the transmitters, for each setting there are four levels. In the pulse image 72, the three colors still represent the three transmitter settings, for each setting there are three pulses. The relationship between the three colors may change. Other combinations and placement of the images are possible.

As shown in FIG. 3, for the specific embodiment of the optical transmitter tuning parameters and filter taps, the tensor builder creates two arrays of tensors. The first array of tensor images 42 includes both the pulse image and the levels image as shown in FIG. 6. This array of tensors and the associated array of transmitter tuning and taps parameters will train the deep learning network C, 50, to predict tuning and tap values. The second array of tensors 44 is an array of level images only, which would look like the tensor image of FIG. 6, but with the pulse image 70 removed. The second array combined with its metadata array of levels and gain tuning parameters will train deep learning network D, 52, to provide tuning parameters for levels and gain.

FIG. 4 shows an embodiment of a system to predict operational, or tuning, parameters for DUTs during run time. As in FIG. 2, compared to FIG. 1, the run time environment has some variations from the training environment. The measurement module 14 again receives multiple waveforms from one DUT, such as the three waveforms above. The system removes and measures the noise, and the tensor builder builds the hyperspectral images to be used to predict the tuning parameters. In this embodiment, the tensor builder creates two single images, one including a levels image and pulse image 46, and one image just including the levels 48, with both types of images including noise and temperature on each color channel of the images.

Deep learning network C 50 receives the levels and pulses image to predict the filter taps tuning parameters for the DUT normalized at 38, and deep learning network D 52 receives the levels image to predict the levels/gain tuning parameters normalized at 40 for the DUT. The predictions may undergo de-normalization as discussed above.

In this manner, a machine learning system can predict values for DUTs using information derived from noise-removed waveforms. This increases the accuracy of the machine learning prediction by reducing the prediction error. While the discussion above focuses on embodiments of predicting performance measurements and tuning parameters, the use of noise-removed waveform data for training and prediction may apply to many different systems for testing and measuring DUTs.

Aspects of the disclosure may operate on particularly created hardware, on firmware, digital signal processors, or on a specially programmed general-purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description refers to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

The previously described versions of the disclosed subject matter have many advantages that were either described or would be apparent to a person of ordinary skill. Even so, these advantages or features are not required in all versions of the disclosed apparatus, systems, or methods.

Examples

Illustrative examples of the disclosed technologies are provided below. An embodiment of the technologies may include one or more, and any combination of, the examples described below.

Example 1 is a test and measurement instrument, comprising: an input port to allow the instrument to receive one or more waveforms from a device under test (DUT); one or more low pass filters to remove a portion of the noise from the waveforms to produce one or more filtered waveforms; and one or more processors configured to execute code that causes the one or more processors to: select one or more waveform patterns from the one or more waveforms; measure noise in the one or more waveforms and generate a noise representation of the noise removed from the one or more waveforms; create one or more images for the one or more waveforms using the one or more waveform patterns and the one or more filtered waveforms; add the noise representation to the one or more images for the one or more waveforms to produce at least one combined image; input the at least one combined image to one or more deep learning networks; and receive one or more predicted values for the DUT from the one or more deep learning networks.

Example 2 is the test and measurement instrument of Example 1, wherein the one or more low pass filters comprise a first low pass filter to produce a first filtered waveform and a second low pass filter to produce a second filtered waveform, and the code that causes the one or more processors to create at least one combined image comprises code that causes the one or more processors to: create a levels image for the waveform using the waveform pattern and the first filtered waveform from the first low pass filter; and create a pulse image for the waveform using the waveform pattern and the second filtered waveform from the second low pass filter.

Example 3 is the test and measurement instrument of either of Examples 1 or 2, wherein the first low pass filter has a pass band lower than the second low pass filter.

Example 4 is the test and measurement instrument of any of Examples 1 through 3, wherein in the port also allows the instrument to receive temperature data for the DUT, and the combined image for each waveform includes a representation of the temperature data.

Example 5 the test and measurement instrument of any of Examples 1 through 4, wherein the code that causes the one or more processors to measure the noise causes the one or more processors to: subtract the filtered waveform from the waveform to find a difference; find a standard deviation of the difference; and use the standard deviation to generate the noise representation.

Example 6 is the test and measurement instrument of any of Examples 1 through 5, wherein the one or more predicted values comprises a predicted transmitter dispersion and eye closure quaternary value and feed-forward equalizer taps.

Example 7 is the test and measurement instrument of Example 6, wherein the code that causes the one or more processors to create one or more images comprises code that causes the one or more processors to create a levels and pulses image including noise.

Example 8 is the test and measurement instrument of any of Examples 1 through 7, wherein the one or more predicted values comprise operating parameters for the DUT.

Example 9 is the test and measurement instrument of Example 8, wherein the code that causes the processor to create one or more images for the one or more waveforms comprises code that causes the one or more processors to: receive one or more waveforms from the DUT, each of the one or more waveforms resulting from the DUT being configured with a different set of reference operating parameters; create the one or more images by creating a levels and pulse image, and a levels image for each of the one or more waveforms from the DUT; and placing the levels and pulse image, the pulse image, and the noise representation for each of the one or more waveforms on a different color channel in the at least one combined image for the DUT.

Example 10 is the test and measurement instrument of Example 8, wherein the code that causes the one or more processors to input the at least one combined image to the one or more deep learning networks comprises code that causes the one or more processors to: input a first combined image to a first deep learning network of the one or more deep learning networks, the first combined image comprising a levels and pulse image and a noise representation; and input a second combined image to a second of the one or more deep learning networks, the second combined image comprising a levels image and a noise representation to a second deep learning network of the one or more deep learning networks.

Example 11 is the test and measurement instrument of any of Examples 1 through 10, the one or more processors further configured to execute code that causes the one or more processors to train the one or more deep learning networks by: acquiring values for a performance measurement using conventional testing for a plurality of waveforms from t a plurality of devices under test; creating at least one array of combined images from the at least one combined image for each of the plurality of waveforms; creating at least one array of performance measurement values corresponding to the at least one array of combined images; using the at least one array of combined images and the array of performance measurement values to train the deep learning networks to produce predicted values.

Example 12 is the test and measurement instrument of Example 11, wherein the code that causes the one or more processors to train the one or more deep learning networks further comprises code that causes the one or more processors to create at least one array of filter tap values corresponding to the at least one array of combined images.

Example 13 is the test and measurement instrument of Example 11, wherein the code that causes the one or more processors to create at least one array of combined images from the at least one combined image comprises code that causes the one or more processors to: create an array of levels and pulse images; create an array of levels images; create an array of levels and gains tuning parameters; use the array of levels and pulse images, and the array of filter tap values to train a first deep learning network of the one or more deep learning networks to predict taps operating parameters for the DUTs; and use the array of levels images and the levels and gains tuning parameters to train a second deep learning network of the one of more deep learning networks to predict levels and gain tuning parameters.

Example 14 is a method of measuring performance of a device under test (DUT) comprising: acquiring one or more waveforms from the DUT; applying one or more low pass filters to the one or more waveforms to produce one or more filtered waveforms; generate a waveform pattern from the waveforms, if not already generated; measuring noise in at least one or the one or more waveforms and generating a noise representation; creating one or more images using the waveform pattern and the one or more filtered waveforms; adding the noise representation to the one or more images to produce at least one combined image; sending the at least one combined image to one or more deep learning networks; and receiving one or more predicted values for the DUT from the one or more deep learning networks, the one or more predicted values including at least a performance measurement value of the DUT.

Example 15 is the method of Example 14, further comprising: receiving temperature data for the DUT; and including the temperature data in the combined image.

Example 16 is the method of either of Examples 14 or 15, wherein measuring noise in the waveforms comprises: subtracting one of the one or more filtered waveforms from the wave form to produce a difference; finding a standard deviation of the difference; and using the standard deviation to generate the noise representation.

Example 17 is the method of any of Examples 14 through 16, wherein applying one or more low pass filters comprises applying a first low pass filter having a first cutoff frequency and a second low pass filter having a second cutoff frequency higher than the first cutoff frequency.

Example 18 is the method of any of Examples 14 through 16, wherein creating one or more images for the waveform comprises: creating a levels image for the waveform using one of the one or more filtered waveforms and the pattern; creating a pulse image for the waveform using another of the one or more filtered waveform and the pattern; and building one or more tensor images that include at least one of the levels image and the pulse image, and the noise representation as the combined image.

Example 19 is the method of Example 18, wherein building one or more tensor images comprises: building a first tensor image from the levels image and the noise representation to be sent to one of the one or more deep learning networks; and building a second tensor image from the levels image and the pulse image, and the noise representation to be sent to another of the one or more deep learning networks.

Example 20 is the method of any of Examples 14 through 19, further comprising training the one or more deep learning networks, by: acquiring values for the performance measurement using conventional testing for a plurality of waveforms from a plurality of devices under test; creating at least one array of combined images from the at least one combined image for each of the plurality of waveforms; creating an array of the performance measurement values corresponding to the at least one array of combined images; using the at least one array of combined images and the array of performance measurement values to train the deep learning networks to produce predicted performance measurement values.

Example 21 is the method of Example 20, wherein creating at least one array of combined images comprises: creating an array of levels and pulse images; creating an array of levels images; using the array of levels and pulse images to train a first deep learning network of the one or more deep learning networks; and using the array of levels images to train a second deep learning network of the one of more deep learning networks.

Although specific examples of the invention have been illustrated and described for purposes of illustration, it will be understood that various modifications may be made without departing from the spirit and scope of the invention. Accordingly, the invention should not be limited except as by the appended claims.

The invention claimed is:

1. A test and measurement instrument, comprising:
an input port to allow the instrument to receive one or more waveforms from a device under test (DUT);
two or more deep learning networks;
one or more low pass filters to remove a portion of the noise from the one or more waveforms to produce one or more filtered waveforms to increase accuracy of predictions from the two or more deep learning networks; and one or more processors configured to execute code that causes the one or more processors to:
select one or more waveform patterns from the one or more waveforms;
measure noise in the one or more waveforms and generate a noise representation of the noise removed from the one or more waveforms;
create one or more images for the one or more waveforms using the one or more waveform patterns and the one or more filtered waveforms;
add the noise representation to the one or more images for the one or more waveforms to produce at least one combined image;
input the at least one combined image to the two or more deep learning networks comprised of at least one first deep learning network trained to produce predicted filter tap values, and at least one second deep learning network trained to produce one of either predicted performance measurement values or predicted operating parameters for the DUT; and
receive one or more of the predicted filter tap values, and the one of either predicted performance measurement values or predicted operating parameters for the DUT from the two or more deep learning networks.

2. The test and measurement instrument as claimed in claim 1, wherein the one or more low pass filters comprise a first low pass filter to produce a first filtered waveform and a second low pass filter to produce a second filtered waveform, and the code that causes the one or more processors to create at least one combined image comprises code that causes the one or more processors to:
create a levels image for the waveform using the waveform pattern and the first filtered waveform from the first low pass filter; and
create a pulse image for the waveform using the waveform pattern and the second filtered waveform from the second low pass filter.

3. The test and measurement instrument as claimed in claim 2, wherein the first low pass filter has a pass band lower than the second low pass filter.

4. The test and measurement instrument as claimed in claim 1, wherein the port also allows the instrument to receive temperature data for the DUT, and the combined image for each waveform includes a representation of the temperature data.

5. The test and measurement instrument as claimed in claim 1, wherein the code that causes the one or more processors to measure the noise causes the one or more processors to:
subtract the filtered waveform from the waveform to find a difference;
find a standard deviation of the difference; and
use the standard deviation to generate the noise representation.

6. The test and measurement instrument as claimed in claim 1, wherein the one of either predicted performance measurement values or predicted operating parameters, comprises the predicted performance measurement value comprising a predicted transmitter dispersion and eye closure quaternary value, and the predicted filter tap values comprises predicted filter tap values for feed-forward equalizer taps.

7. The test and measurement instrument as claimed in claim 6, wherein the code that causes the one or more processors to create one or more images comprises code that causes the one or more processors to create a levels and pulses image including noise.

8. The test and measurement instrument as claimed in claim 1, wherein the one of either predicted performance measurement values or predicted operating parameters comprise predicted operating parameters for the DUT.

9. The test and measurement instrument as claimed in claim 8, wherein the code that causes the processor to create one or more images for the one or more waveforms comprises code that causes the one or more processors to:

receive one or more waveforms from the DUT, each of the one or more waveforms resulting from the DUT being configured with a different set of reference operating parameters;

create the one or more images by creating a levels and pulse image, and a levels image for each of the one or more waveforms from the DUT; and placing the levels and pulse image, the pulse image, and the noise representation for each of the one or more waveforms on a different color channel in the at least one combined image for the DUT.

10. The test and measurement instrument as claimed in claim 8, wherein the code that causes the one or more processors to input the at least one combined image to the one or more deep learning networks comprises code that causes the one or more processors to:

input a first combined image to the at least one first deep learning network, the first combined image comprising a levels and pulse image and a noise representation; and input a second combined image to the at least one second deep learning networks, the second combined image comprising a levels image and a noise representation to a second deep learning network of the one or more deep learning networks.

11. The test and measurement instrument as claimed in claim 1, the one or more processors further configured to execute code that causes the one or more processors to train the at least one first deep learning network by:

acquiring values for a performance measurement using conventional testing for a plurality of waveforms from a plurality of devices under test;

creating at least one array of combined images from the at least one combined image for each of the plurality of waveforms;

creating at least one array of performance measurement values corresponding to the at least one array of combined images; and using the at least one array of combined images and the array of performance measurement values to train the deep learning networks to produce predicted performance measurement values.

12. The test and measurement instrument as claimed in claim 1 the one or more processors are further configured to execute code that causes the one or more processors to train at least one first deep learning network further comprises code that causes the one or more processors to create at least one array of filter tap values corresponding to the at least one array of combined images.

13. The test and measurement instrument as claimed in claim 11, wherein the code that causes the one or more processors to create at least one array of combined images from the at least one combined image comprises code that causes the one or more processors to:

create an array of levels and pulse images;

create an array of levels images;

create an array of levels and gains tuning parameters;

use the array of levels and pulse images, and the array of filter tap values to train the at least one first deep learning network to predict filter tap values for the DUTs; and use the array of levels images and the levels and gains tuning parameters to the at least one second deep learning network to predict levels and gain operating parameters.

14. A method of measuring performance of a device under test (DUT) comprising:

acquiring one or more waveforms from the DUT;

applying one or more low pass filters to the one or more waveforms to produce one or more filtered waveforms to increase accuracy of predictions from two or more deep learning networks;

generating a waveform pattern from the one or more waveforms, if not already generated;

measuring noise in at least one of the one or more waveforms and generating a noise representation;

creating one or more images using the waveform pattern and the one or more filtered waveforms;

adding the noise representation to the one or more images to produce at least one combined image;

sending the at least one combined image to two or more deep learning networks comprised of at least one first deep learning network trained to produce predicted filter tap values, and at least one second deep learning network trained to produce one of either predicted performance measurement values or predicted operating parameters for the DUT; and receiving one or more of the predicted filter tap values, and the one of either predicted performance measurement values or predicted operating parameters for the DUT.

15. The method as claimed in claim 14, further comprising:

receiving temperature data for the DUT; and including the temperature data in the combined image.

16. The method as claimed in claim 14, wherein measuring noise in the waveforms comprises:

subtracting one of the one or more filtered waveforms from the waveform to produce a difference;

finding a standard deviation of the difference; and using the standard deviation to generate the noise representation.

17. The method as claimed in claim 14, wherein applying one or more low pass filters comprises applying a first low pass filter having a first cutoff frequency and a second low pass filter having a second cutoff frequency higher than the first cutoff frequency.

18. The method as claimed in claim 14, wherein creating one or more images for the waveform comprises:

creating a levels image for the waveform using one of the one or more filtered waveforms and the waveform pattern;

creating a pulse image for the waveform using another of the one or more filtered waveform and the waveform pattern; and building one or more tensor images that include at least one of the levels image and the pulse image, and the noise representation as the combined image.

19. The method as claimed in claim 18, wherein building one or more tensor images comprises:

building a first tensor image from the levels image and the noise representation to be sent to the at least one first deep learning network; and building a second tensor image from the levels image and the pulse image, and the noise representation to be sent to the at least one second deep learning network.

20. The method as claimed in claim 14, further comprising training the at least one second deep learning network, by:

acquiring values for the performance measurement using conventional testing for a plurality of waveforms from a plurality of devices under test;

creating at least one array of combined images from the at least one combined image for each of the plurality of waveforms;

creating an array of the performance measurement values corresponding to the at least one array of combined images; and using the at least one array of combined images and the array of performance measurement values to train the at least one second deep learning networks to produce the predicted performance measurement values.

21. The method as claimed in claim 20, wherein creating at least one array of combined images comprises:

creating an array of levels and pulse images;

creating an array of levels images;

using the array of levels and pulse images to train the at least one first deep learning network; and using the array of levels images to train the at least one second deep learning network.

* * * * *